United States Patent [19]

Cavigelli

[11] Patent Number: 5,317,277

[45] Date of Patent: May 31, 1994

[54] POWER AMPLIFYING APPARATUS FOR SUPPLYING A.C. SIGNALS HAVING A MAXIMUM LOOP GAIN AT A DESIRED FREQUENCY

[75] Inventor: George A. Cavigelli, Lexington, Mass.

[73] Assignee: Doble Engineering Company, Watertown, Mass.

[21] Appl. No.: 986,762

[22] Filed: Dec. 8, 1992

[51] Int. Cl.⁵ .............................................. H03F 1/34
[52] U.S. Cl. ...................................... 330/109; 330/103
[58] Field of Search ................. 330/99, 100, 103, 105, 330/107, 109, 150

[56] References Cited

U.S. PATENT DOCUMENTS

| | | | |
|---|---|---|---|
| 4,091,333 | 5/1978 | Thrap | 330/100 |
| 4,541,040 | 9/1985 | Allfather | 363/37 |
| 4,686,619 | 8/1987 | Edwards | 363/126 |
| 4,794,507 | 12/1988 | Cavigelli | 363/86 |
| 4,973,919 | 11/1990 | Allfather | 330/310 |
| 5,197,102 | 3/1993 | Sordermeyer | 330/109 X |

*Primary Examiner*—Steven Mottola
*Attorney, Agent, or Firm*—Fish & Richardson

[57] ABSTRACT

The invention features power amplifying apparatus with controllable frequency characteristic of the gain. The apparatus includes a band pass network of two cascaded amplifiers and multiple resistors and capacitors arranged to form multiple feedback loops. The feedback loops stabilize the output A.C. signals and establish a predetermined bandwidth of the network. The apparatus also includes a capacitor resistor feedback loop, connected to the output of the second amplifier and input of the first amplifier, with the capacitor and the resistor selected to maximize the loop gain at a desired frequency.

15 Claims, 7 Drawing Sheets

POWER AMPLIFYING APPARATUS FOR SUPPLYING A.C. SIGNALS HAVING A MAXIMUM LOOP GAIN AT A DESIRED FREQUENCY

For background, reference is made to U.S. Pat. No. 4,794,507 issued Dec. 27, 1988, entitled "Controlling Electrical Power" incorporated by reference.

The present invention relates, in general, to current controlling and, more specifically, concerns controlling the frequency characteristic of the gain of a current source.

It is an important object of the invention to provide improved apparatus and technique for controlling frequency characteristic of the gain of a power source. In one aspect the invention features power amplifying apparatus for supplying A.C. signals with a maximum loop gain at a desired frequency. The apparatus comprises a band pass network including first and second cascaded amplifiers. The amplifiers include multiple feedback loops with multiple resistors and capacitors. The feedback loops are constructed and arranged to stabilize the output A.C. signals and to establish predetermined bandwidths of the network. The apparatus also includes a capacitor-resistor feedback loop with a capacitor and a resistor connected in series. The capacitor-resistor feedback loop is arranged to connect the output of the second amplifier and the input of the first operational amplifier. The capacitor and the resistor of the capacitor-resistor feedback loop are selected to maximize the loop gain of the amplifying apparatus at the desired frequency in the bandwidth. Apparatus of the type just described wherein one of the multiple feedback loops includes two resistors in series and a grounded capacitor forming a T-network. This feedback loop is connected to an output node of one of the amplifiers, constructed and arranged to operate as an inverting amplifier, and to the noninverting input of the operational amplifiers constructed and arranged to operate as an integrator.

In another aspect, the invention features power amplifying apparatus for supplying A.C. signals having a maximum loop gain at a desired frequency. The apparatus includes a first operational amplifier, having inverting and noninverting inputs and an output, constructed and arranged to operate as an integrator, and a second amplifier, having inverting and noninverting inputs and an output, constructed and arranged to operate as a power amplifier and cascaded with the first operational amplifier. The apparatus also includes a signal input node coupled to the noninverting input of the first operational amplifier, a signal output node coupled to the output of the second amplifier, and a capacitor connected between the input node and the noninverting input of the first operational amplifier. The apparatus also includes two feedback loops. The first feedback loop, arranged to connect the output node and the noninverting input of the first amplifier, includes two resistors in series and a grounded capacitor forming a T-network. The second feedback loop arranged to connect the output node to the noninverting input of the first amplifier includes a capacitor and a resistor connected in series. The capacitor and the resistor of the second feedback loop are selected to establish the maximum of the loop gain of the amplifying apparatus at the desired frequency.

Preferred embodiments of these aspect of the invention may include one or more of the following features. The apparatus may include an output port and an output transformer including a primary connected to the output node and a secondary connected to the output port. The output transformer is adapted to furnish impedance transformation and may also be adapted to provide a D.C. isolation.

The apparatus may include an output current sensor arranged in a feedback loop connecting the secondary of the output transformer to the input node. The output current sensor includes a shunt resistor connected in series with the output port, and an operational amplifier having an input connected to the shunt resistor.

The apparatus of the type just described wherein the amplifier connected to the shunt resistor is a noninverting amplifier.

The apparatus may include an isolation amplifying system, connected to the signal input node, constructed and arranged to provide D.C. isolation.

The apparatus may further include an inverting amplifying stage, connected to the isolation amplifying system, constructed and arranged to receive input voltage and feedback voltage from the output current sensor. The input voltage and the feedback voltage are coupled to the input of the inverting amplifying stage.

Other features and advantages will become apparent from the following detailed description when read in connection with the accompanying drawing in which.

Figure 1:
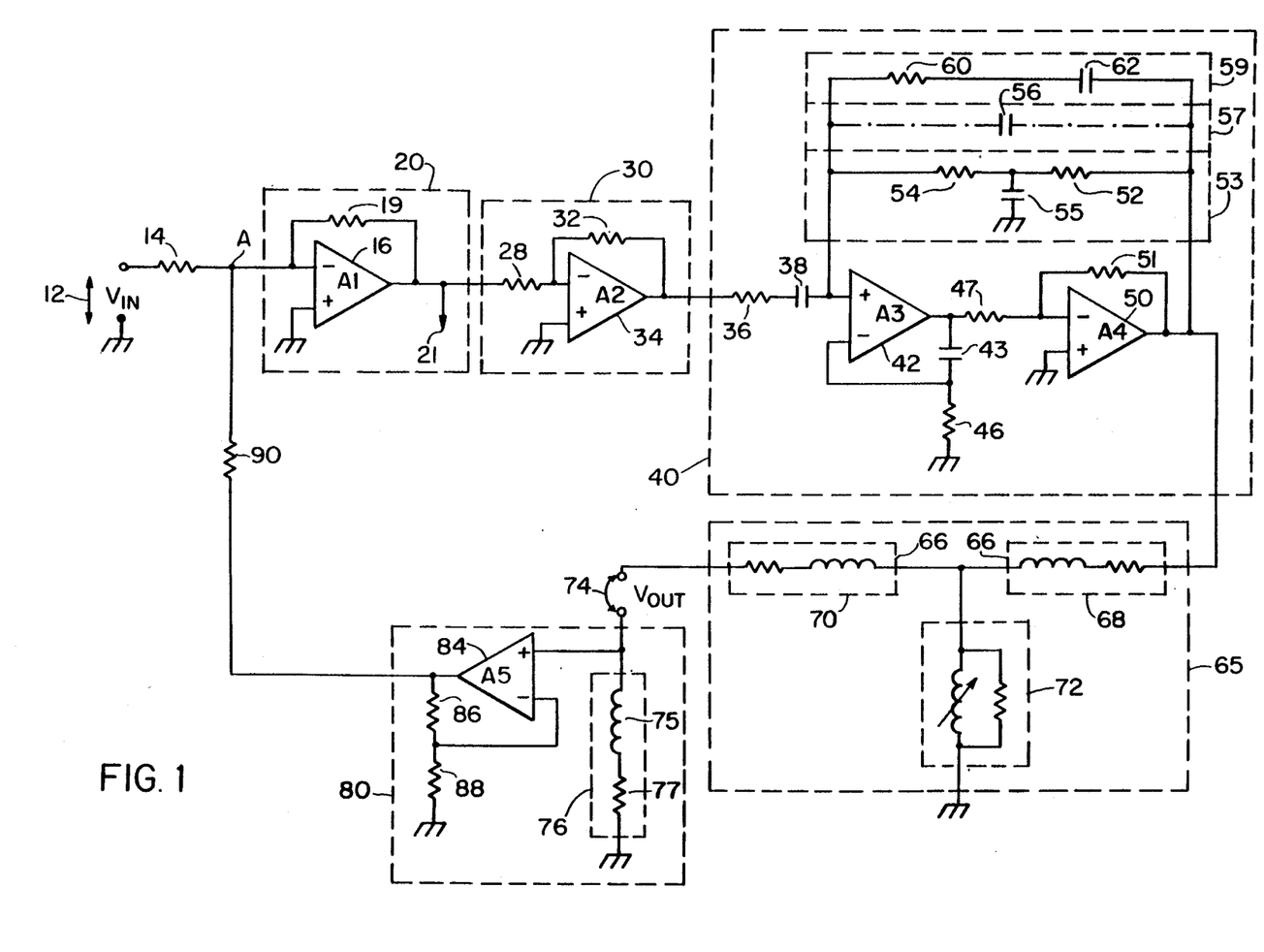
FIG. 1 is a combined block-schematic circuit diagram of a current source according to the invention.

With reference now to the drawing and more particularly FIG. 1 thereof, a current source according to the invention comprises an inverting gain stage 20 cascaded with an isolation amplifying system 30, a power amplifying system 40, an output transformer coupling system 65 and an output current sensor 80 arranged in a main feedback loop. An input voltage $V_{in}$ enters input terminals 12. The input voltage is coupled to the inverting input of operational amplifier A1 that is cascaded with isolation amplifier A2 and further cascaded with operational amplifier A3 and power amplifier A4. The output of power amplifier A4 is connected to the primary of output transformer 65. The secondary of output transformer 65 is connected to output terminals 74 and output current sensor 80 that includes amplifier A5. Output current sensor 80 comprises the main feedback loop that is connected to node A on the input of amplifier A1.

Having broadly described the physical arrangement of the system of FIG. 1, its mode of operation will be discussed. Input resistances 14 and 90 and resistance 19 in the negative feedback loop determine the gain of amplifier A1. An input resistance 28 interconnects the output of amplifier A1 and the inverting input of isolation system 30.

Isolation amplifier system 30 provides an isolation barrier on the input side of operational amplifier A3 that serves as a dominant integrator. This isolation system is formed by a parallel arrangement of high frequency stage and low frequency stage. The high frequency stage include a transformer with primary and secondary windings and a high pass filter with a cutoff frequency of about 1 kHz. The low frequency components include an optocoupler stage transmitting spectral components from D.C. to about 1 kHz, all disclosed and described in the above-cited U.S. Pat. No. 4,794,507.

Both the dominant integrator comprising operational amplifier A3 and power amplifier A4 are operated at line potential. Power amplifier A4 operates as a main power amplifier and drives the primary of transformer 65. The negative input of operational amplifier A3 is coupled to ground through resistor 46, and the positive input of amplifier A3 is tied to the primary of output transformer 65 through a negative feedback loop formed by resistors 52 and 54 so that the voltage across the primary of transformer 65 is approximately equal to the voltage difference at the input side of operational amplifier A3, assuming infinite open loop gain of this operational amplifier. Operational amplifier A3 receives only A.C. signal because capacitor 38 blocks any D.C. component. Resistor 51 completes the negative feedback loop of power amplifier A4.

The feedback network of amplifiers A3 and A4 comprises a parallel arrangement of three loops, 53, 57, and 59. Loop 53 includes resistors 52 and 54 and capacitor 55 in a T-arrangement. Loop 57, which is optional, includes capacitor 56. Loop 59 includes resistor 60 and capacitor 62 connected in series. This network will be further discussed in connection with FIGS. 3A and 3B.

Output transformer 65 provides impedance matching between power amplifying system 40 and a variety of load impedances connected to output terminals 74. Shunt resistor 76 having inductive component 75 and resistive component 77 is in series with the load. Output transformer 65 does not transmit D.C. D.C. feedback loop 53 furnishes a minimum D.C. offset to primary of output transformer 65 to prevent saturation of transformer 65. The feedback loop of amplifier A3 is connected to ground through resistor 46 to eliminate offset voltage on power amplifier A4 output.

The magnetizing inductance of the transformer is highly variable. (The output transformer shown in FIG. 1 is a simplification that assumes a transformer ratio of 1:1 and no galvanic isolation.) At high frequencies, leakage inductance 66 of the primary is in series with the load. At low frequencies, the resistance of the primary is high compared to the impedance of leakage inductance 66 and coacts with the magnetizing inductance to establish the low frequency cutoff. Proximity effect and skin effect in the transformer (inductance 66) shift the phase difference between the current and the voltage to about 75 degrees. This phase shift helps to maintain stability of the power source for almost any passive load. The stability is maintained if the output impedance has no negative real component; that is, the phase angle of the output impedance is within ±90 degrees. Output transformer provides isolation to one end of the secondary to be grounded by shunt resistor 76.

The main feedback loop of the system comprises output current sensor 80 arranged to sense the output current through the load and furnish a current feedback signal to node A. Voltage across resistor 76 is effectively compared to the input voltage (12). Output current sensor 80 includes shunt amplifier A5, resistance 86 that comprises a negative feedback loop of amplifier A5, and comprises resistance 88 that connects the amplifier A5 feedback loop to ground.

Figure 2:
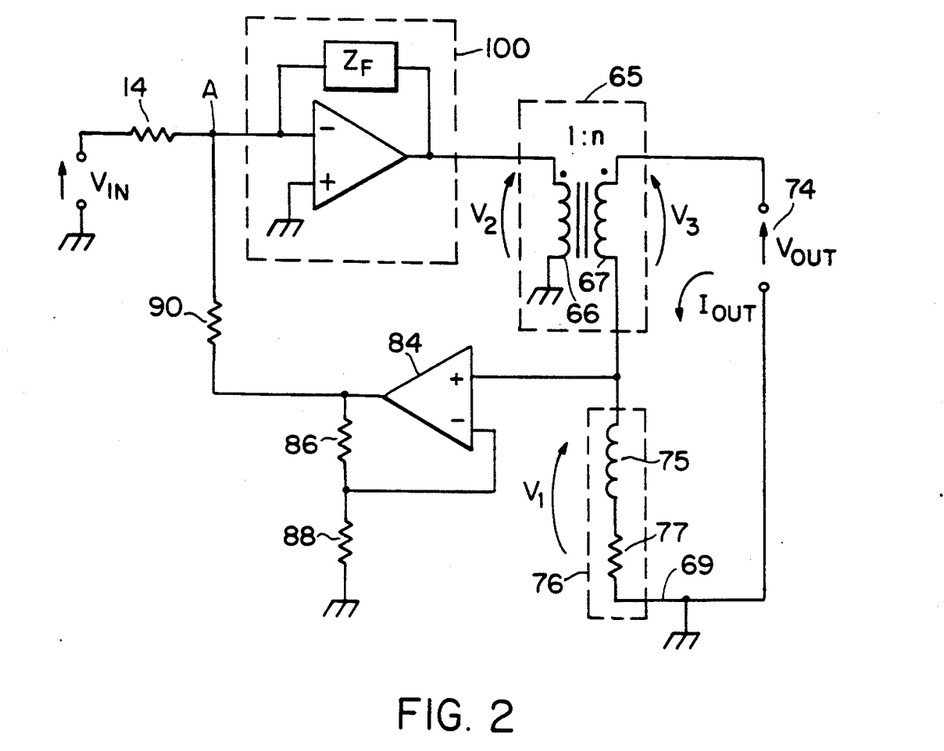
FIG. 2 is a simplified schematic circuit diagram of FIG. 1 used to explain the feedback control.

Amplifier A5 embodies two operational amplifiers. The first amplifier with a fixed gain is connected across shunt resistor 76. The second amplifier is used to change gain when switching output ranges. The primary and secondary windings of transformer 65 are connected in parallel or in series, or in a combination thereof to obtain different transformation ratios. Referring also to FIG. 2, when the secondary of output transformer 65 is switched to another winding with a different transformation ratio, there is a different output current, $I_{out}$, flowing in secondary loop 69. Thus, there is a voltage change across shunt resistor 76 and the first amplifier 84 of feedback amplifier A5. To substantially reduce net changes in the main feedback loop, the second amplifier of different gain is used. For example, when increasing the current in the secondary loop less gain is used to reduce the net change in the main feedback loop.

Referring to FIG. 2, a simplified circuit model of the current source includes a power amplifying system 100 that represents the inverting gain amplifying stage, the isolation amplifying system and the power amplifying system cascaded together having feedback impedance $Z_F$. The output of system 100 is coupled to primary 66 of output transformer 65. Secondary 67 of transformer 65 is in series with the load connected to output terminals 74 and shunt resistor 76. Shunt amplifier 84 has a large gain and is coupled by resistor 90 to node A. The net voltage across shunt 76 is proportional to the output current, $I_{OUT}$, that is different for each selected range. Transformer 65 is adapted to match the load; different transformation ratios and different gain in current sensor 80 are selected at the same time. By varying the gain of amplifier 84 the voltage across resistor 90 is kept substantially constant. The induced voltage varies with the selected secondary winding, as the ranges are changed. Extra phase margin of the system is provided by inductance 75 of shunt 76.

The output impedance of the system is given as a ratio of output voltage and output current at zero input voltage.

$$Z_{OUT} = \frac{V_{OUT}}{I_{OUT}},$$

wherein $V_{IN}=0$ It can be shown that $$Z_{OUT} = r \cdot G$$

wherein G is the loop gain of the system and r is the value of the shunt resistance 77. Thus, similarly as for the gain, the output impedance is frequency dependent and, for the types of load used in the field of protection relay testing, it is desirable to achieve the maximum impedance in the range of 50 Hz to 60 Hz. However, it is also important to reduce the gain at high frequencies so that the loop remains stable.

One important aspect of the invention is illustrated in FIGS. 3A, 3B, 4A and 4B. Amplifying stage 40, shown separately in FIGS. 3A and 3B, includes two above-described amplifiers cascaded together and a feedback loop 53 connecting output node F of power amplifier A4 to input node D of operational amplifier A3 that provides a large gain.

Figure 4A:
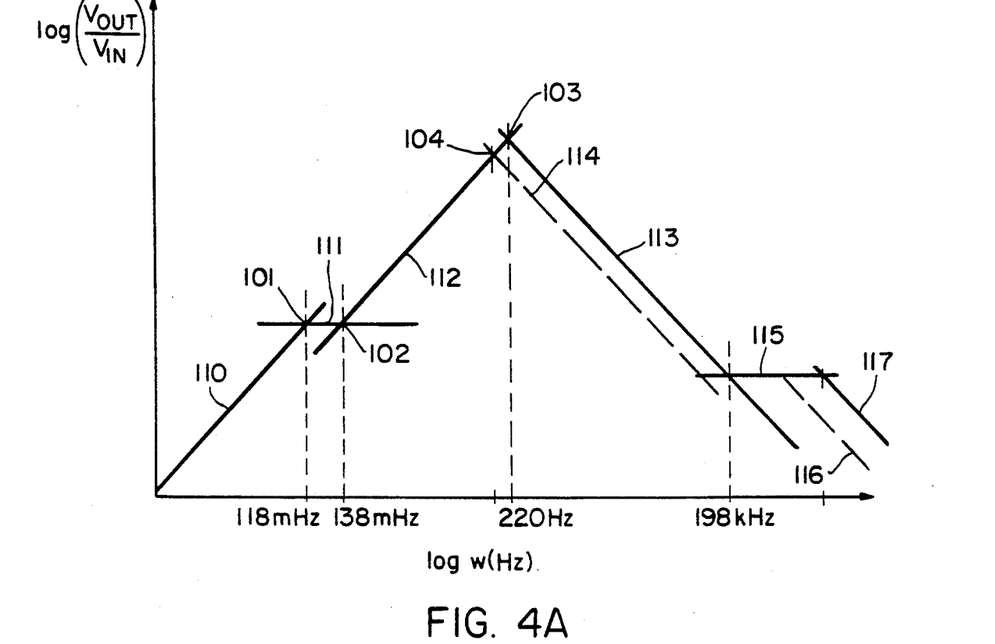
FIGS. 4A and 4B are graphs of the frequency response of the loop gain for the cascaded amplifier systems of FIGS. 3A and 3B, respectively.

Logarithmic frequency dependence of the gain ($V_{out}/V_{in}$) is shown in FIG. 4A. The loop gain increases with frequency from zero at zero frequency to a plateau 111 at about 118 mHz (point 101) due to capacitor 38 and resistor 36. The gain is frequency independent, as shown by a solid line 111, between about 118 mHz and 138 mHz (point 102) due to action of resistor 36 and resistors 52 and 54 in loop 53. At higher frequencies, the gain reaches its maximum (point 103) at about 290 Hz since at high frequencies the gain of operational amplifier A3 is limited proportionally by decreasing reactance of capacitor 43 (solid line 113).

Figure 3A:
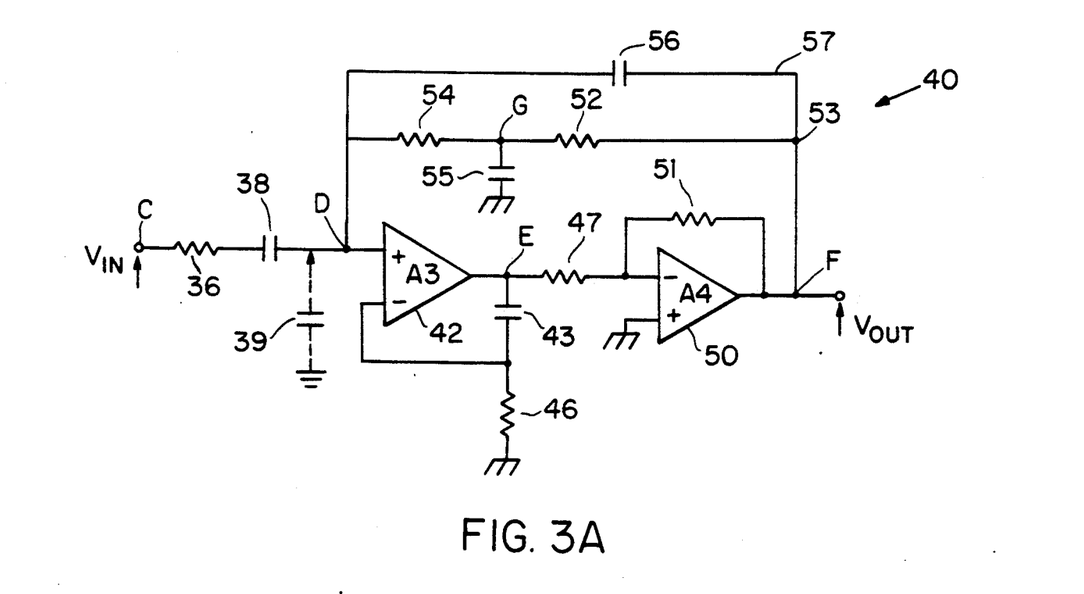
FIGS. 3A and 3B are schematic circuit diagrams of two cascaded amplifiers with frequency shaping feedback loops.
Figure 3B:
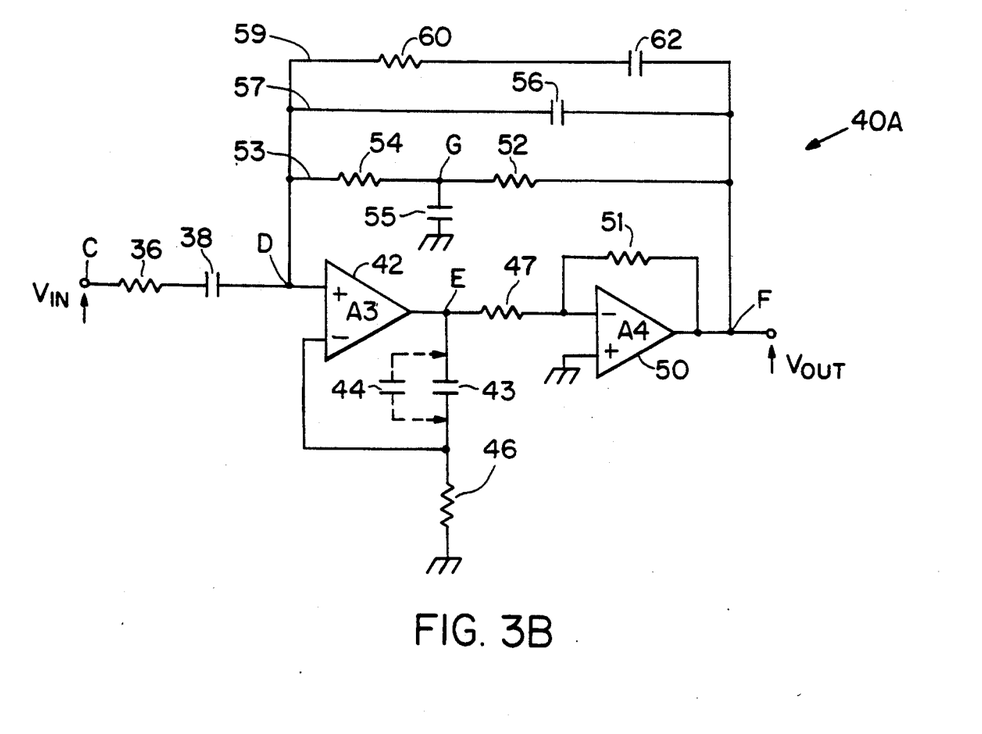

Due to the circuit connections and mode and reset switches, there is an additional stray capacitance 39 shown in FIG. 3A. To counteract the stray capacitance, an additional capacitance 56 connected in parallel with loop 53 can be introduced (FIG. 3B). This capacitance effectively reduces the reactance of capacitance 43 and thus lowers the gain (broken line 114). The intersection of lines 112 and 114 defines the gain maximum that is located at about 220 Hz. The effect of capacitor 56, can be also represented by a capacitor 44 connected in parallel with capacitor 43. Parasitic capacitance 39 also reduces the loop stability at high frequencies. Additional capacitor 56 of loop 57 connected in parallel with loop 53 improves the loop stability (as shown in FIG. 3B). However, capacitor 56 reduces the high frequency gain (broken line 116, FIGS. 4A, 4B).

Figure 3C:
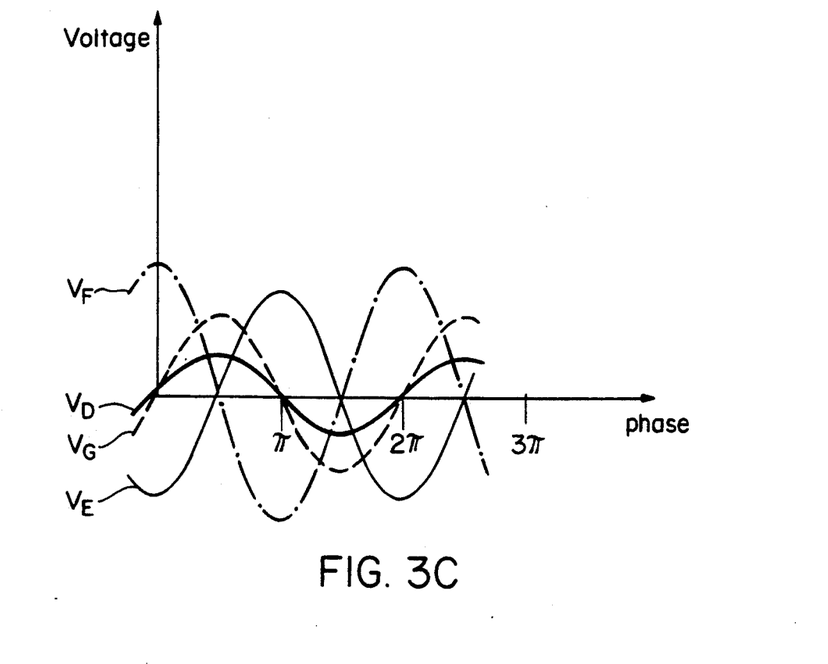
FIG. 3C displays voltage characteristics at different nodes of the cascaded amplifiers of FIGS. 3A and 3B.
Figure 5A:
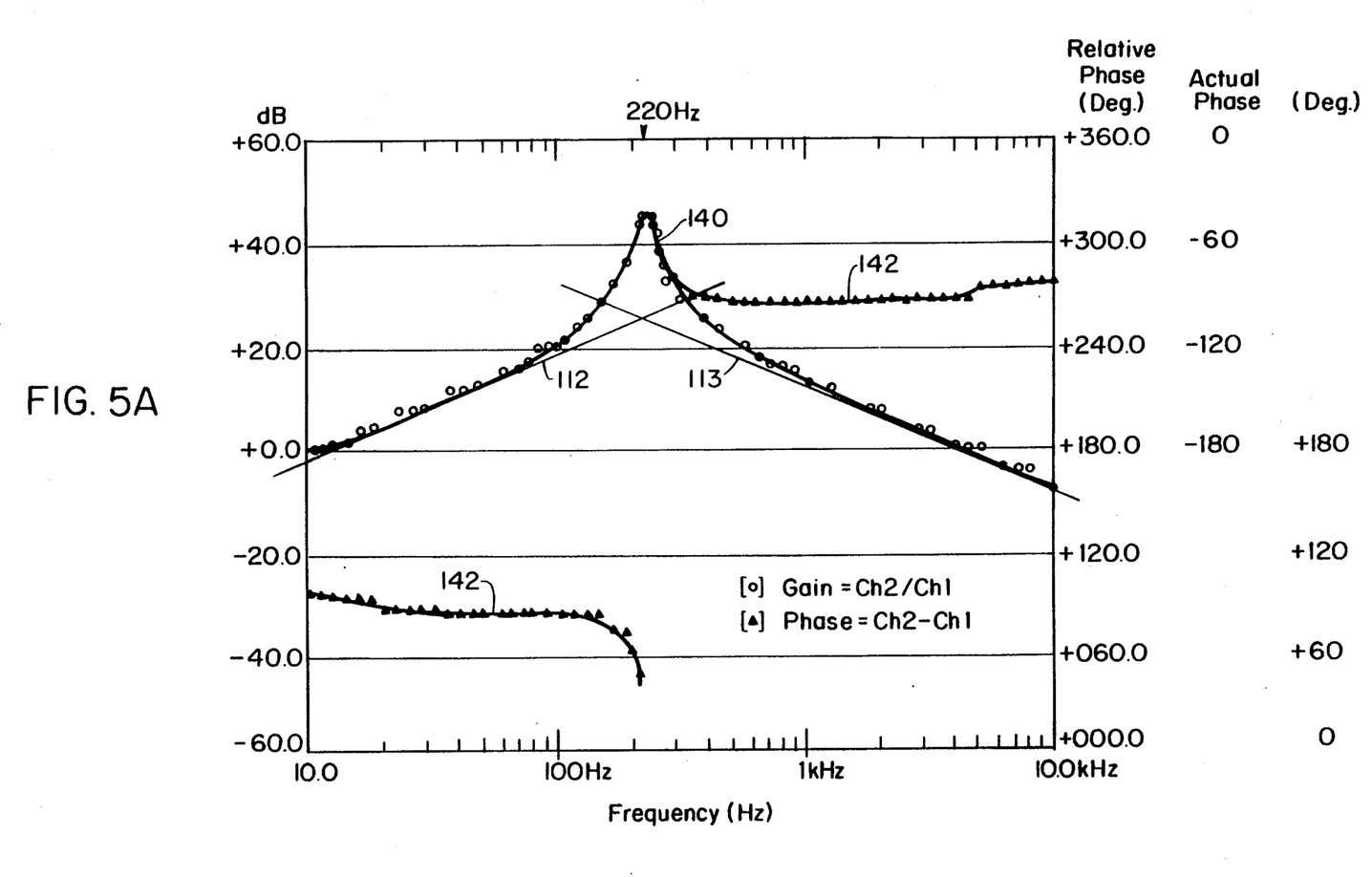
FIGS. 5A and 5B are graphs depicting measured frequency dependence of the loop gain of a current source utilizing the cascaded amplifiers of FIGS. 3A and 3B, respectively.

Also referring to FIG. 3C, input voltage $V_D$ of amplifier A3 (node D) is amplified and phase shifted by 90° at a node E. Voltage $V_E$ is further amplified and phase shifted by 180° by amplifier A4 to obtain voltage $V_F$ that is coupled by feedback loop 53 to input node D. At node G, voltage $V_G$ is phase shifted by 90° due to the action of capacitor 55. Thus voltages $V_D$ and $V_G$ are in phase. Since the amplitude of voltage $V_G$ is larger than the amplitude of input voltage $V_D$, amplifying stage 40 has a negative value of input impedance $Z_{IN}=R_{54} V_D/(V_D-V_G)$. Thus, this resonating system exhibits a gain increase at about 220 Hz (i.e., intersection of lines 112 and 114). FIG. 5A depicts measured frequency dependence of the loop gain (line 140) and phase (line 142) using frequency analyzer Voltech TF2000. The analyzer uses a reference that is a 1K$\Omega$ resistance (zero phase shift) connected to CH1. The measured gain has a peak at about 220 Hz which is in good agreement with the above discussed analysis.

Figure 4B:
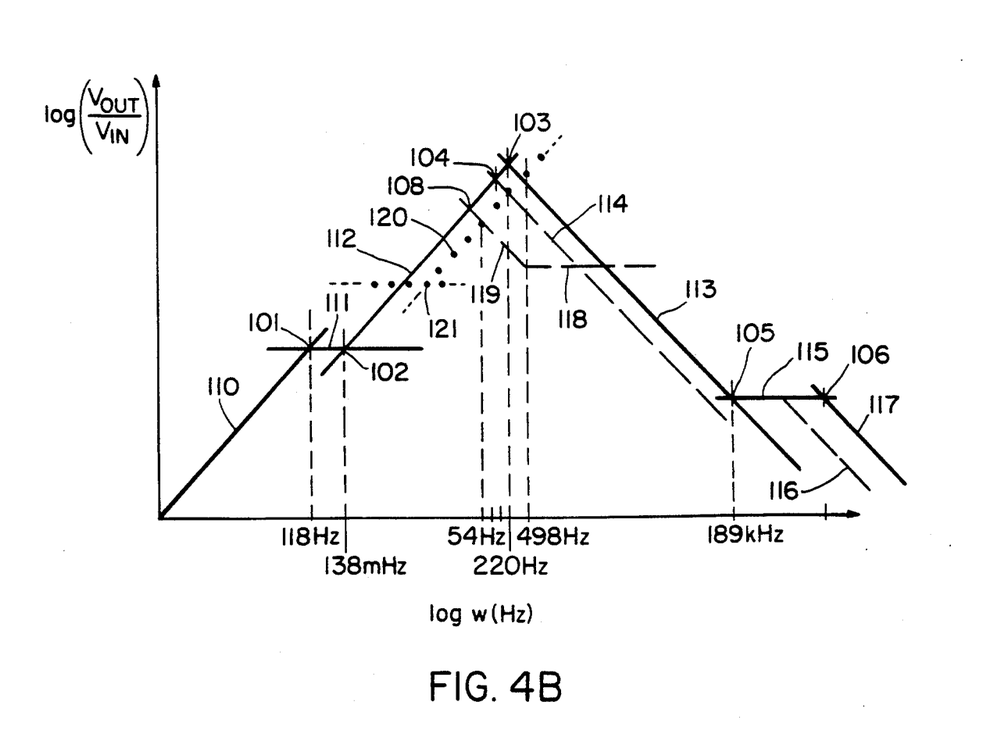

When it is desirable to achieve maximum gain at frequencies in the range of 50 Hz to 60 H, the frequency response could be further shaped by increasing capacitance 56 and thus lowering the gain similarly as capacitance 43 (line 114) does. However, additional increase in capacitance 56 would further reduce the high frequency gain, as discussed above. To lower the frequency response and still achieve a substantially unaffected high frequency gain, resistor 60 and capacitor 62 connected in series are introduced to form feedback loop 59 in parallel with feedback loops 53 and 57 (FIG. 3B). As shown in FIG. 4B, capacitor 62 lowers the gain in the 60 Hz to 500 Hz region (broken line 119), but at about 500 Hz resistor 60 in series with capacitor 62 opposes this action so that the gain becomes frequency independent (broken line 118). The modified network has a desired bandwidth with maximum gain at a frequency of about 54 Hz at the intersection of lines 112 and 119.

In one embodiment of FIG. 3B, values of the elements are as follows: $R_{36}=18k\Omega$, $R_{46}=1.5k\Omega$, $R_{47}=3.3k\Omega$, $R_{51}=22k\Omega$, $R_{52}=120k\Omega$, $R_{54}=18k\Omega$, $R_{60}=2.2M\Omega$, $C_{38}=2.35\mu F$, $C_{43}=820pF$, $C_{55}=7.5\ \mu F$, $C_{56}=10pF$ and $C_{62}=510pF$. Due to the large reactance of capacitors 56 and 62 and large resistance of resistor 60, there is a relatively small current in loops 57 and 59 when compared with loop 53. Thus addition of loops 57 and 59 affects only minimally voltage $V_G$. FIG. 3C also provides a good description for amplifying stage 40A of FIG. 3B. Since the system is in resonance, it exhibits gain increase at the intersection of lines 112 and 119 and forms a pass band.

The shaping of the frequency response could be also achieved by adding a few operational amplifiers, but they would introduce instability into the system at high frequencies since the phase margin of the system is only about 15 degrees.

The output impedance, which is proportional to the gain, determines the load regulation, i.e., difference of the magnitude and phase of the output current $I_{OUT}$ in the load compared to the short circuit current. Thus, for preferred performance of the power source, it is desirable to obtain a maximum in the output impedance in the frequency range of the load, which is 50 Hz to 60 Hz in the field of protection relay testing.

Figure 5B:
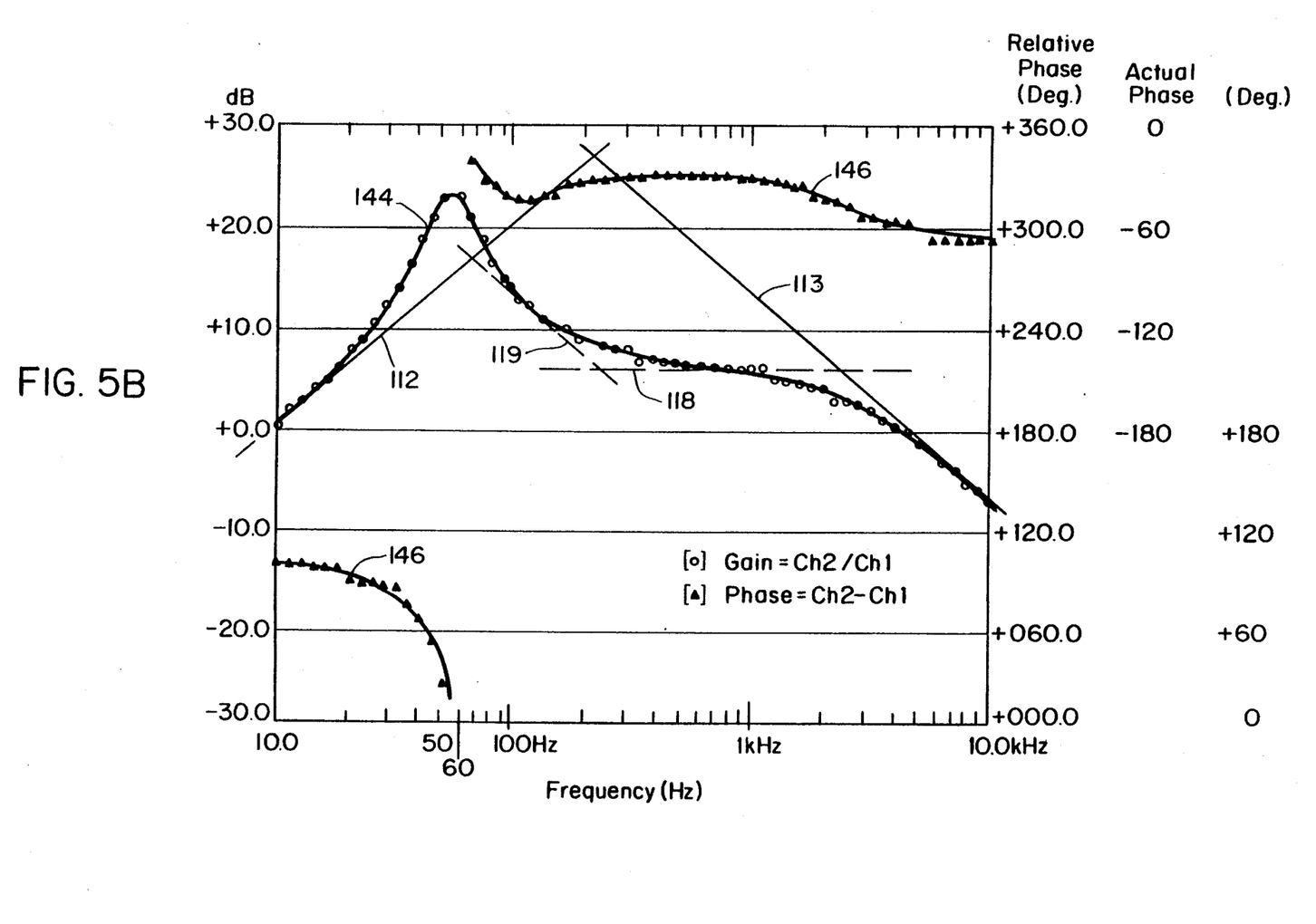

As mentioned above, the measured loop gain has a maximum at about 220 Hz for the power source of FIG. 1 without the capacitor-resistor feedback loop 59 (FIG. 5A). Addition of feedback loop 59 of capacitor 62 and resistor 60 reduces the gain in the frequency range of about 50 Hz to 500 Hz (line 119) and moves the gain maximum down to a frequency of about 54 Hz. This is confirmed in FIG. 5B that depicts measured frequency dependence of the gain (line 144) and phase (line 146) for the power source of FIG. 1. The maximum gain is shifted to about 50 Hz. Similarly as in FIG. 5A, the system exhibits gain increase and an abrupt phase shift at the resonance frequency. Addition of resistor 60 and capacitor 62 located in loop 59 achieves several improvements. The output impedance $Z_{OUT}$ becomes more resistive at medium frequencies (line 146 of FIG. 5B), which is beneficial when driving nonlinear loads with large inductive or capacitive components. The output impedance that is nearly resistive at frequencies in the range of 500 Hz to 2 kHz can substantially eliminate ringing transients in the output current caused by a resonance of the source and the load. At frequencies above 2 kHz, the leakage impedance of the output transformer causes significant losses that minimize possible resonance. Furthermore, location of the output impedance in the 50 Hz to 60 Hz range significantly improves the load regulation for the fundamental frequency.

Additional shaping of the loop gain of the current source can be also achieved by connecting a capacitor-resistor feedback loop in parallel with the feedback loop of the isolation amplifying system or the inverting gain stage.

Figure 6:
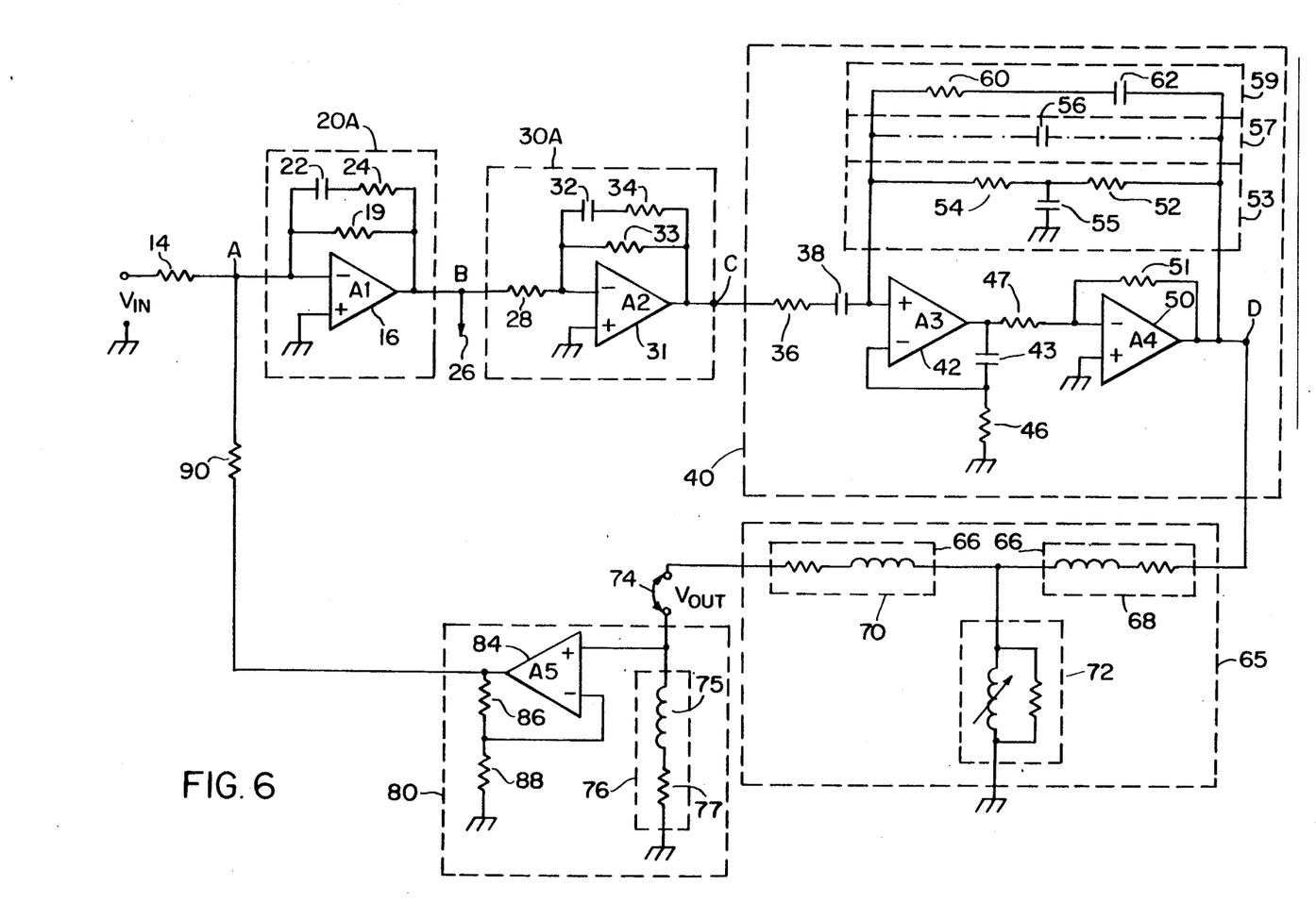
FIG. 6 is a combined block-schematic circuit diagram of an additional embodiment of the current source of FIG. 1.

In the low frequency region, the core of the output transformer can be saturated under certain transient conditions. This saturation reduces the loop margin that could lead to instabilities. Addition of capacitor 32 and resistor 34 connected in series in a feedback loop arrangement to isolation system 30A, as shown in FIG. 6, increases the phase margin in the low frequency region. Dotted lines 120 and 121 of FIG. 4B show the effect of the additional capacitor-resistor feedback loop in the low frequency region. Alternatively, the capacitor-resistor feedback loop can be placed in inverting amplifier stage 20A, such as with capacitor 22 and resistor 24.

We have described novel apparatus and techniques for improving the gain of a power source. The invention is applicable to different types of power sources. A typical power source includes power amplifiers that receive D.C. potentials from rectifying and filtering circuitry directly coupled to the conventional A.C. power lines.

The rectifying circuitry can include a full wave bridge rectifier circuit coupled to a storage inductor with two windings and a saturating inductor. The output of the bridge rectifier may be connected to a D.C. output terminal for producing output voltages for the amplifiers. As described in the above-cited U.S. Pat. No. 4,794,507, the D.C. potential provided by the full-wave rectifier may be compared with a ramp signal having an external ramp set point related to the D.C. output potential relative to a reference potential to provide a trigger pulse for controlling the time an SCR is gated on. A balancing system may selectively switch auxiliary resistances in and out to maintain a desired balance. Upon sensing a gross imbalance, the SCR is turned off.

The power source can include an isolation amplifier with a combining network that combines a high frequency path and a low frequency path. The output of the signal combiner may be coupled to the input of the power amplifiers. The power amplifiers may include like class B amplifiers having substantially the same gain driving the primary of the output transformer.

Other embodiments are within the claims.

What is claimed is:

1. Power amplifying apparatus for supplying A.C. signals having a maximum loop gain at a desired frequency, said apparatus comprising:
    band pass network including first and second cascaded amplifiers,
    said amplifiers including multiple feedback loops with multiple resistors and capacitors,
    said feedback loops being constructed and arranged to stabilize the output A.C. signals and to establish predetermined bandwidth of said network,
    a capacitor-resistor feedback loop including a capacitor and a resistor connected in series,
    said capacitor-resistor feedback loop arranged to connect the output of the second amplifier and the input of the first amplifier, and
    the capacitor and the resistor of said capacitor-resistor feedback loop selected to maximize the loop gain of said amplifying apparatus at said desired frequency in said bandwidth.

2. Power amplifying apparatus for supplying A.C. signals having a maximum loop gain at a desired frequency, said apparatus comprising:
    a first operational amplifier, having inverting and noninverting inputs and an output, constructed and arranged to operate as an integrator,
    a second amplifier, having inverting and noninverting inputs and an output, constructed and arranged to operate as a power amplifier and cascaded with said first operational amplifier,
    a signal input node coupled to the noninverting input of said first operational amplifier,
    a signal output node coupled to the output of said second amplifier,
    a capacitor connected between said input node and the noninverting input of said first operational amplifier,
    a first feedback loop arranged to connect said output node and the noninverting input of said first amplifier,
    said first feedback loop including two resistors in series and a grounded capacitor forming a T-network, and
    a second feedback loop arranged to connect said output node to the noninverting input of said first amplifier,
    said second feedback loop including a capacitor and a resistor connected in series, and
    said capacitor and said resistor of said second feedback loop selected to establish the maximum of the loop gain of said amplifying apparatus at said desired frequency.

3. The apparatus of claim 1 wherein one of said multiple feedback loops includes two resistors in series and a grounded capacitor forming a T-network,
    said one feedback loop, connected to an output node of one of said amplifiers constructed and arranged to operate as an inverting amplifier and to the noninverting input of the other of said amplifiers constructed and arranged to operate as an integrator.

4. The apparatus of claim 2 and further comprising an output port and an output transformer including a primary connected to said output node and a secondary connected to said output port,
    said output transformer adapted to furnish impedance transformation.

5. The apparatus of claim 4 wherein said output transformer is further adapted to furnish a D.C. isolation.

6. The apparatus of claim 3 and further comprising an output port and an output transformer including a primary connected to said output node and a secondary connected to said output port,
    said output transformer adapted to furnish an impedance transformation.

7. The apparatus of claim 6 wherein said output transformer is further adapted to furnish a D.C. isolation.

8. The apparatus of claim 4 and further comprising an output current sensor arranged in a feedback loop connecting the secondary of said output transformer to said input node,
    said output current sensor including:
        a shunt resistor connected in series with said output port, and
        an operational amplifier having an input connected to said shunt resistor.

9. The apparatus of claim 6 and further comprising an output current sensor arranged in a feedback loop connecting the secondary of said output transformer to said input node,
    said output current sensor including:
        a shunt resistor connected in series with said output port, and
        an operational amplifier having an input connected to said shunt resistor.

10. The apparatus of claim 8 wherein said amplifier connected to said shunt resistor is a noninverting amplifier.

11. The apparatus of claim 9 wherein said amplifier connected to said shunt resistor is a noninverting amplifier.

12. The apparatus of claim 4 and further comprising an isolation amplifying system, connected to said signal input node, constructed and arranged to provide D.C. isolation.

13. The apparatus of claim 6 and further comprising an isolation amplifying system, connected to said signal input node, constructed and arranged to provide D.C. isolation.

14. The apparatus of claim 12 and further comprising an inverting amplifying stage, connected to said isolation amplifying system, constructed and arranged to receive input voltage and feedback voltage from said output current sensor, said input voltage and said feedback voltage being coupled to the input of said inverting amplifying stage.

15. The apparatus of claim 13 and further comprising an inverting amplifying stage, connected to said isolation amplifying system, constructed and arranged to receive input voltage and feedback voltage from said output current sensor, said input voltage and said feedback voltage being coupled to the input of said inverting amplifying stage.

* * * * *